(12) United States Patent
Heidari et al.

(10) Patent No.: US 7,137,336 B2
(45) Date of Patent: Nov. 21, 2006

(54) STAMP HAVING AN ANTISTICKING LAYER AND A METHOD OF FORMING OF REPAIRING SUCH A STAMP

(75) Inventors: Babak Heidari, Furulund (SE); Torbjörn Ling, Lund (SE)

(73) Assignee: Obducat AB, Malmo (SE)

( * ) Notice: Subject to any disclaimer, the term of this patent is extended or adjusted under 35 U.S.C. 154(b) by 49 days.

(21) Appl. No.: 10/482,710

(22) PCT Filed: Jul. 4, 2002

(86) PCT No.: PCT/SE02/01334

§ 371 (c)(1),
(2), (4) Date: Oct. 6, 2004

(87) PCT Pub. No.: WO03/005124

PCT Pub. Date: Jan. 16, 2003

(65) Prior Publication Data

US 2005/0039618 A1 Feb. 24, 2005

(30) Foreign Application Priority Data

Jul. 5, 2001 (SE) .................................... 0102411

(51) Int. Cl.
*B41K 1/38* (2006.01)
(52) U.S. Cl. .................... 101/368; 101/401; 101/401.1
(58) Field of Classification Search ................ 101/368, 101/401.1
See application file for complete search history.

(56) References Cited

U.S. PATENT DOCUMENTS 5,512,131 A * 4/1996 Kumar et al. ................ 438/738
6,027,595 A 2/2000 Suleski ........................ 156/230
6,923,930 B1 * 8/2005 Ling et al. ................... 264/293

FOREIGN PATENT DOCUMENTS

| EP | 0244884 | * 12/2003 |
| WO | WO2004/000567 | * 11/1987 |
| WO | 0000868 | 1/2000 |
| WO | 0054107 | 9/2000 |

* cited by examiner

*Primary Examiner*—Andrew H. Hirshfeld
*Assistant Examiner*—Joshua Zimmerman
(74) *Attorney, Agent, or Firm*—Finnegan, Henderson, Farabow, Garrett & Dunner, L.L.P.

(57) ABSTRACT

A stamp for use in transferring a pattern in nano-scale has a monomolecular antisticking layer. The anti-sticking layer comprises molecular chains, which are covalently bound to the surface of the stamp and which each comprise at least one fluorine-containing group. Each molecular chain contains a group Q, which comprises a bond which is weaker than the other bonds in the molecular chain as well as the covalent bond that binds the molecular chain to the surface of the stamp. Splitting of said bond in the group Q creates a group Q1, which is attached to the part of the molecular chain being left on the surface of the stamp and which is capable of reacting with a fluorine-containing compound to restore the antisticking layer. In a method of manufacturing a stamp for use in transferring a pattern in nanoscale, the stamp is provided with the above-mentioned molecular chain. In a method of repairing a damaged antisticking layer of the above-mentioned stamp, the stamp is treated with a repairing reagent, which has a coupling end, which is capable of reacting with the group Q1, and a fluorine-containing group located at the other end of the repairing reagent.

15 Claims, No Drawings

STAMP HAVING AN ANTISTICKING LAYER AND A METHOD OF FORMING OF REPAIRING SUCH A STAMP

FIELD OF THE INVENTION

The present invention relates to a stamp for use in transferring a pattern in nanoscale, which stamp has a monomolecular antisticking layer.

The invention also relates to a method of manufacturing a stamp for use in transferring a pattern in nanoscale, which stamp has a monomolecular antisticking layer.

The invention further relates to a method of repairing said monomolecular antisticking layer.

BACKGROUND ART

In the replication of nanostructures, use is often made of a stamp, which hot embosses a pattern into a plate coated with a suitable polymer, such as a thermoplastic. It is necessary to provide an antisticking boundary surface between the patterned stamp and the polymer to prevent thermoplastic from getting stuck to and contaminating the surface of the stamp when the stamp is released from the coated plate after embossing. Also the pattern replicated on the plate can be damaged by such sticking. For successful embossing, the stamp must thus be chemically and mechanically stable and have a low tendency to stick to polymers.

In Microelectronic Engineering 35 (1997) 381–384, R. W. Jaszewski et al. disclose that the surface of the stamp can be covered with an ultra-thin, antisticking layer of PTFE. The layer is precipitated by means of plasma polymerization or ion sputtering from a plasma. According to Jaszewski et al., the quality of the film deteriorates in the embossing. Obviously, the film is not sufficiently stable.

SUMMARY OF THE INVENTION

According to the present invention, the above drawbacks are obviated or reduced and a stamp with an antisticking layer is obtained, which is stable, has good antisticking properties and can easily be repaired when damaged or worn.

More specifically, the invention provides a stamp for use in transferring a pattern in nanoscale, which stamp has a monomolecular antisticking layer and is characterised in that said antisticking layer comprises molecular chains, which are covalently bound to the surface of the stamp and which each comprise at least one fluorine-containing group, each molecular chain containing a group Q, which comprises a bond which is weaker than the other bonds in the molecular chain as well as the covalent bond that binds the molecular chain to the surface of the stamp, splitting of said bond in the group Q creating a group Q1, which is attached to the part of the molecular chain being left on the surface of the stamp and which is capable of reacting with a fluorine-containing compound to restore the antisticking layer.

The invention further relates to a method of manufacturing a stamp for use in transferring a pattern in nanoscale, which stamp has a monomolecular antisticking layer, said method being characterised in that the surface of the stamp is provided with molecular chains, which are covalently bound to the surface of the stamp and which each comprise at least one fluorine-containing group and a group Q, which comprises a bond which is weaker than the other bonds in the molecular chain as well as the covalent bond that binds the molecular chain to the surface of the stamp, splitting of said bond in the group Q creating a group Q1, which is attached to the part of the molecular chain being left on the surface of the stamp and which is capable of reacting with a fluorine-containing compound to restore the antisticking layer.

The invention also relates to a method of repairing a damaged monomolecular antisticking layer on a stamp as stated above, which method is characterised in that the stamp is treated with a repairing reagent, which has a coupling end, which is capable of reacting with the group Q1, and a fluorine-containing group located at the other end of the repairing reagent, that the coupling end of the repairing reagent is bound to the group Q1 which is attached to the surface of the stamp, the group Q being formed anew.

Further advantages and features of the invention will be apparent from the description below and the appended claims.

DETAILED DESCRIPTION OF THE INVENTION

A non-limiting example of transferring a pattern in nanoscale is nanoembossing lithography or nanoimprint lithography, which is a technique for mass-production of nanostructures. A stamp is provided with a nanopattern on its surface. The stamp is heated and pressed against a substrate which is coated with a polymer layer, whereby the pattern is transferred to the polymer layer. Nano-imprinting is described in more detail in U.S. Pat. No. 5,772,905 and U.S. Pat. No. 5,259,926. The stamp according to the present invention can also be used in other embossing processes.

The expression "nanoscale" is not to be understood as only relating to structures within the range of sub-micrometers, that is, structures having a size within the range of 1–1000 nm. A stamp often has a pattern with structures within the range of submicrometers as well as structures with a size of up to 100 micrometers and more, for instance up to about 5 mm. The present invention is preferably applicable to stamps comprising structures within the range of submicrometers and/or within the range of 1–100 micrometers. The best effect of the invention is achieved with structures within the range of submicrometers since such structures are relatively more sensitive to sticking when releasing the stamp.

The present invention is based on the discovery that a stable antisticking layer can be provided on the surface of the stamp by attaching molecular chains to the stamp which have antisticking properties. The molecular chains are formed in such a manner that the antisticking properties can easily be recreated when the antisticking layer is worn after being used for some time.

The surface of the stamp is conveniently made of a material M which is suitable for producing nanostructured patterns. Examples of such materials M are Si, Al, Ti, Ni, Cr and oxides thereof. Si is particularly suitable since it has satisfactory hardness and is easy to work when forming patterns in nanoscale. If the surface is made of metal, such as Al, Ti, Cr, Ni, it is normally preferable for the surface to have an oxide layer. To obtain a stronger oxide layer, the surface can be oxidized, for instance by means of an oxygen plasma. In some metals, such as Ni, Cr, it is particularly suitable to generate such a stronger oxide layer.

According to a preferred embodiment of the invention, a first and a second reagent are used. The first reagent is bound in a first reaction to the surface of the stamp, whereas the second reagent is bound in a second reaction to the first reagent. The reason why this embodiment is preferred is that it is relatively easy to obtain commercially available compounds which can suitably be used as first and second reagents.

A first reagent to be used in manufacturing the stamp according to the invention has at least two functional groups. A first functional group is intended to bind to the surface of the stamp. One example of such a first functional group is a silane group with the formula $(B0)_{3-n}R'_n Si—$. The silane group can be bound to the surface of the stamp by means of a group B1 on the surface of the stamp, which can be M- or M-O—, where O is oxygen. In the present application, "silane group" also relates to the above group after this group has been bound to the stamp. The silane group can comprise n aliphatic groups R' and 3-n reactive binding groups B0, where n=0, 1 or 2. B0 is suitably a hydrolizable group. Suitable reactive binding groups B0 are chlorine (Cl) or alkoxy groups, preferably $C_{1-4}$ alkoxy groups, more preferably $C_{1-2}$ alkoxy groups, such as ethoxy groups (EtO), methoxy groups (MeO). The aliphatic groups R' are suitably, if they are at all present, short saturated aliphatic groups, preferably $C_{1-4}$ alkyl groups, more preferably $C_{1-2}$ alkyl groups such as ethyl groups and methyl groups. When n=1 or 2 and R' is a methyl group, a smaller binding surface is obtained, that is, the monomolecular layer can be packed tighter. The strongest bond to the surface is, however, obtained when n=0, that is, when the silane group has three reactive binding groups B0. Thus, one example of a suitable first functional group is:

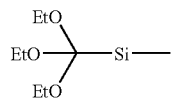

[first functional group in the form of triethoxysilane]

The second functional group X1 of the first reagent is suitably selected so as not to react or so as to react only to a limited extent with the surface of the stamp. Such a functional group has the advantage that a homogeneous monomolecular layer with a well-defined end group is provided when treating the surface of the stamp with the first reagent. Thus, the group X1 is suitably a nonhydrolizable group. The group X1 should not either react with the first functional group. Suitable groups X1 are, for instance, —SH, —NH$_2$ and —OH. When X1 is an —NH$_2$ group, B0 must not be chlorine, since this would result in undesirable polymerization reactions.

The first and second functional groups of the first reagent are suitably attached at two opposed ends of a carbon compound R1. Preferably, such a carbon compound R1 is a carbon chain, which is unbranched or has short branches which suitably have a length of 1–6 carbon atoms, more preferably 1–3 carbon atoms. The carbon chain is suitably a saturated, aliphatic carbon chain. Unsaturated carbon chains can participate in undesirable side reactions and highly branched or cyclic compounds take up unnecessary room at the surface of the stamp, which reduces the density of the antisticking functionality on this surface.

The second functional group X1 can affect the electron density in the closest atoms in the molecule, which may result in undesirable effects on the first functional group. Therefore, it is suitable that the R1 group should have a structure that "isolates", in terms of electron density, the group X1 from the first functional group. In aliphatic, saturated carbon chains, the CH$_2$ group which is situated closest to X1 is highly affected, the next CH$_2$ group is somewhat affected, whereas the third CH$_2$ group is substantially unaffected by X1. The group R1 is suitably unsubstituted so as not to affect negatively the first and second functional groups. Very long carbon chains increase the risk of a break on the chain and make the antisticking layer less stable, as the carbon chains can change their angle to the surface. Thus, R1 suitably has a length, from the first to the second functional group, of 1–10 carbon atoms, preferably 2–5 carbon atoms and most preferably 3 carbon atoms. The group R1 can also be provided with shorter branches, suitably of a length of 1–4 carbon atoms, preferably 1–2 carbon atoms, for instance, with a view to increasing the antisticking functionality or to enhancing the bond to the surface:

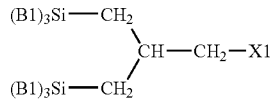

(branched R1 group with stronger attatchment]

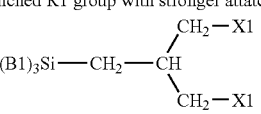

(branched R1 group with more X1 groups]

When in the last-mentioned example X1 is —SH, a sulfur bridge S—S usually forms. The sulfur bridge will react in the same way as two separate —SH groups and is therefore equivalent to these groups.

It is suitable to select a first reagent which fulfills the criteria described above and which is available on the market. Examples of preferred first reagents are thus mercaptopropyltriethoxysilane:

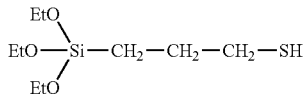

and aminopropyltriethoxysilane:

$$\begin{array}{c} EtO \\ EtO—Si—CH_2—CH_2—CH_2—NH_2 \\ EtO \end{array}$$

The second reagent comprises a first part X2, which is intended to be bound to the X1 group of the first reagent, and a second part R2, which has an antisticking functionality.

The group X2 is selected so as to be suitable for reaction with the X1 group in the first reagent. The reaction should result in a bond which is sufficiently strong to maintain the antisticking functionality at the surface of the stamp. The bond which forms between X1 and X2 is, however, weaker than the other bonds in the monomolecular layer. Any break on the molecular chain will thus occur in a predictable position, namely between X1 and X2. Examples of suitable combinations of X1 and X2 are: X1=—SH group and X2=—SH group, which can form a sulfur bridge, X1=—NH$_2$ group and X2=Cl—(C=O)—, which can form a peptide bond, and X1=—OH and X2=HO—(C=O)—, which can form an ester. It is particularly preferable that X1 as well as X2 should be —SH groups, since they form a bond which is strong enough to maintain the antisticking functionality, but is weaker than, for instance, bonds between carbon atoms in the molecular chain, between carbon atoms and sulfur atoms and between a silane group and the surface of the stamp.

The group R2 suitably contains fluorine atoms, which yield the desirable antisticking functionality. It is particularly suitable that R2 should have a free end group, which contains a carbon atom to which one or more fluorine atoms are bound. Preferably the group R2 is a fluorinated, aliphatic, saturated carbon chain. Unsaturated carbon chains can participate in undesirable side reactions and highly branched or cyclic compounds take up too much space, which reduces the density of the antisticking functionality.

The fluorine atoms will affect the electron density in the closest atoms in the molecule, which may result in undesirable effects on the bond between X2 and X1. Therefore, it is suitable that the group R2 should have a structure that "isolates", in terms of electron density, the X2 group from the fluorine atoms. In aliphatic, saturated carbon chains, the CH$_2$ group closest to a carbon atom, which is substituted with fluorine, is highly affected, whereas the next CH$_2$ group is almost unaffected. The group R2 suitably has at least 1 and preferably 2 CH$_2$ groups in a row closest to the group X2. In longer chains of CH$_2$ groups, there is an increasing risk of breakage. Thus, the number of CH$_2$ groups in a row should not exceed 5.

R2 suitably has at least one perfluorinated carbon atom. Preferably this carbon atom is the end group of the R2 group, that is a CF$_3$ group. More perfluorinated carbon atoms result in better antisticking functionality. Very long carbon chains increase the risk of a break on the chain and make the antisticking layer less stable, as the carbon chains can change their angle to the surface. Thus, R2 suitably has 1–12 perfluorinated carbon atoms, preferably 2–8 perfluorinated carbon atoms and most preferably 3–6 perfluorinated carbon atoms. The group R2 can also be provided with shorter branches, suitably of a length of 1–6 carbon atoms, more preferably 1–3 carbon atoms, for instance with a view to increasing the antisticking functionality or to enhancing the bond by attaching to two groups X1.

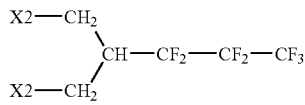

[branched group R2 with stronger attatchment]

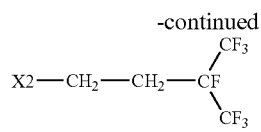

[branched group R2 with more CF$_3$ groups]

The last-mentioned variant, which is branched at the end of the group R2 that is situated furthest away from the group X2, has a larger "head". The nanostructured pattern on the surface of the stamp is like a landscape with crests and valleys. It may sometimes be difficult to provide a sufficiently high density of the antisticking functionality at the crests. An R2 group which is branched and has two or more CF$_3$ groups at the end that is not intended to bind to the first reagent fills out the space better, thereby improving the antisticking functionality at the crests, sharp corners and other structures on the surface of the stamp.

It is suitable to select a second reagent, which fulfills the criteria described above and which is available on the market. Examples of preferred second reagents are thus 1H, 1H, 2H, 2H-perfluorooctanethiol:

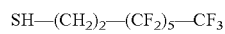

and fluorinated organic acid chlorides, such as 2H, 2H, 3H, 3H-perfluorohexaneacidchloride:

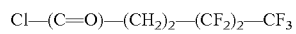

According to a less preferred embodiment of the invention, one single reagent is used. This single reagent is bound in a reaction to the surface of the stamp. The reason why this embodiment is less preferred is that there are few commercially available compounds which, in one and the same compound, comprise suitable functional groups which can bind to the surface of the stamp, groups which have antisticking properties and in addition Q groups, which comprise a weaker bond. The single reagent used in this less preferred embodiment suitably has properties involving the above groups and being similar to the properties described above concerning the first and second reagents, with the exception that the above groups X1 and X2 are replaced by a group Q. Thus, this single reagent can, for instance, have the formula (B0)$_{3-n}$R'$_n$SiR1QR2, where the respective groups suitably have the properties and limitations described above. An example of a suitable single reagent in this less preferred embodiment is:

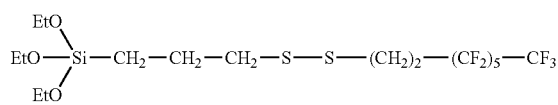

In a preferred method of manufacturing a stamp according to the invention, the nanostructured pattern is first formed on the surface of the stamp. This patterning can be effected, for instance, by etching or in some other prior-art manner. The surface which, for instance, can be a silicon surface, is subsequently cleaned by means of, for instance, 1–4 organic solvents, such as trichloroethylene, ethanol, acetone and isopropanol, in succession. The last solvent is suitably isopropanol, which is particularly suitable to ensure that the surface is free from water. In some cases, it is necessary to etch away the oxide layer of the surface, for instance, with fluoro-hydrogen acid, HF, (10–40% solution) to provide a homogeneous surface layer. The stamp is then treated with the first reagent. The first treatment can be performed in either liquid phase or in gaseous phase.

In a first treatment in liquid phase, the stamp is placed for about 1–5 h in a vessel containing about 0.1–1% of the first reagent in an organic solvent, suitably an alkane, at room temperature. The stamp is then washed, suitably by means of a series of 1–4 organic solvents similar to those mentioned above to remove the compounds which have not been covalently bound to the surface.

In a first treatment in gaseous phase, the stamp is placed in an oven with nitrogen gas atmosphere at a temperature of about 50–250° C., suitably about 150–220° C., and at a pressure at which the first reagent is in gaseous phase, usually a pressure of about 0.5–20 kPa, suitably about 1–3 kPa. The exact combination of temperature and pressure is selected in such a manner that the current first reagent is certain to be in gaseous phase. The first reagent is subsequently injected into the oven, vaporized and allowed to react with the stamp for about 0.5–10 h. Then the stamp is removed from the oven and allowed to cool, whereupon it is washed with a series of organic solvents as described above.

The gaseous phase reaction is much more complicated to perform than the comparatively easy liquid phase reaction. Nevertheless, the gaseous phase reaction often yields a much more homogeneous monolayer on the surface of the stamp and is thus preferable in many cases.

Thus, in a silicon stamp and using the preferred first reagents mentioned above, the following results can be obtained after the first treatment:

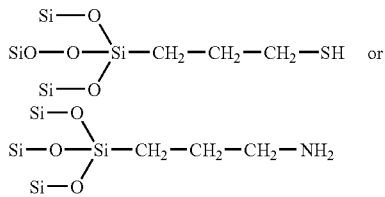

Depending on the original structure of the surface, the actual structure of the bond between the silicon surface and the silane group as well as the residual product, that is ethane or ethanol in the example above, can be somewhat affected. It is assumed, although not demonstrated, that the outermost layer of the surface can have, for instance, the composition Si, SiH, SiOH or SiO depending on how the surface has been treated. The bond between the silicon surface and the silane group is assumed to have the structure $(Si)_3Si$ or $(Si-O)_3Si$, but the exact structure is not completely clear. The above formulas are thus intended to designate a silane group which is bound to a silicon surface, irrespective of the exact structure of the actual bond.

After that, the washed stamp is treated with the second reagent. This second treatment can be effected both in liquid phase and in gaseous phase.

In a second treatment in liquid phase, the stamp is placed in a vessel containing a suitable solvent, for instance an alkane, with about 1–10% of the second reagent at room temperature. The reaction is allowed to continue for about 6–24 h, whereupon the stamp is taken out and cleaned by dipping into one or more baths with a suitable, organic solvent, for instance alkane as above. The stamp is then dried and ready for use in nanoimprinting.

In a second treatment in gaseous phase, the stamp is placed in an oven with nitrogen gas atmosphere at a temperature of about 50–200° C., preferably about 70–120° C. The oven is evacuated to a low pressure, suitably about 1–20 kPa, more preferably about 5–10 kPa. The exact combination of temperature and pressure is selected in such a manner that the current second reagent is certain to be in gaseous phase. The second reagent is injected into the oven, vaporized and allowed to react for about 1–10 h with the monolayer on the surface of the stamp. The stamp is removed from the oven, allowed to cool, then cleaned in the above-described manner and is subsequently ready for use in nanoimprinting.

In the second treatment, the surface of the stamp is already from the beginning covered with a monomolecular layer. Consequently, a reaction in gaseous phase is usually not advantageous to the homogeneity of the layer. The reaction in liquid phase is much more easy to perform and normally preferable in the second treatment. However, in case of very small nanostructures a reaction in gaseous phase is sometimes necessary to obtain a sufficiently even layer after the reaction.

The groups X1 of the first reagent can sometimes be bound to each other. One example is groups X1 in the form of —SH groups which can form sulfur bridges, S—S, both within one and the same molecule and between several molecules. Therefore, the second reagent should be added in large excess, since such an excess tends to break any internal bonds between the groups X1 of the first reagent.

Thus, in a reaction between the above-described product after the first treatment and the above-described preferred second reagents, the following results can be obtained after the second treatment when the groups X1 and X2 have reacted and formed a group Q in the form of S—S and NH—C=O, respectively:

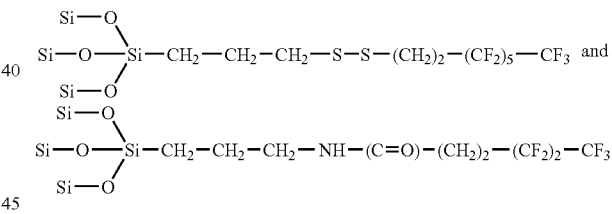

According to a less preferred embodiment, an antisticking layer is formed by attaching directly a ready-made molecular chain to the surface of the stamp, for instance a molecular chain comprising a group which can bind to the surface of the stamp, a Q group and at least one fluorine-containing group. However, such a ready-made molecular chain, which can for instance be in the form of the above-described single reagent, is usually expensive and difficult to obtain, which makes the above-described preferred method comprising a first and a second treatment in succession usually preferable to a direct attachment in one step of a ready-made molecular chain. Attachment of a ready-made molecular chain, in one single step according to the last-mentioned, less preferred embodiment, is performed substantially in the same manner and under the same conditions as described above in connection with the first treatment.

A ready-made group Q can also be included in the first or the second reagent already from the beginning. In such a case, the group Q is thus not formed of X1 and X2.

When a stamp has been used for many nanoimprinting operations, its antisticking layer may be damaged. Such damage can arise when parts of the monomolecular layer get stuck to the polymer layer during embossing or the layer can be damaged when the stamp is released from the polymer layer after embossing or when the stamp is being cleaned. It is normally very expensive to discard such a damaged stamp and manufacture a new one.

According to a preferred embodiment of the invention, the group Q is selected so that a bond in the group Q is somewhat weaker than the other bonds in the molecular chain as well as the covalent bond which attaches the molecular chain to the surface of the stamp. The weaker bond in the group Q will thus break first when the molecular chain is exposed to strain, for instance, tensile or bending stress. A damaged antisticking layer will then be deprived of its antisticking functionality but normally have an intact monomolecular layer comprising short molecular chains with a well defined end group Q1 which has formed when the group Q was split. Such a damaged layer can have the following structure:

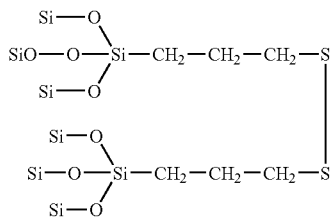

The end group Q1 shown above in the form of an internal sulfur bridge can instead be separate groups Q1 bound to the respective CH$_2$ groups in the form of —SH groups depending on the conditions prevailing at the occurrence of the damage and how the stamp has been treated since then. The damaged antisticking layer can easily be repaired, thereby recovering its original antisticking functionality in the following way. First, the stamp is washed with some suitable organic solvent, for instance an alkane. The stamp is then placed in a vessel which contains a suitable solvent, for instance an alkane, with about 1–10% of a repairing reagent at room temperature. The reaction is allowed to proceed for about 6–24 h, whereupon the stamp is taken up and cleaned by dipping into one or more baths with a suitable, organic solvent, for instance the above alkane. The stamp, which after the repair treatment has an antisticking layer of substantially the same quality as when the stamp was new, is subsequently dried and is then ready to be used again in nanoimprinting.

The repairing reagent will normally be the same compound as the second reagent which was used when the original antisticking layer was manufactured since such a repairing reagent normally yields the most even surface. It is, however, also possible to use a repairing reagent that fulfills the above criteria for a second reagent, but that is not exactly identical to the second reagent which is used in the manufacture of the stamp. One example of the latter is that it can, under some conditions, be of interest during repair to attach a somewhat longer or more branched molecular chain. The reason for this is that the wear on the antisticking layer is usually most important at the angles and similar structures where the surface coverage of the molecular chains is at its minimum. By binding a longer and/or more branched chain to these worn positions when repairing, a thicker more resistant layer is obtained in exactly the positions of maximum wear.

If the stamp has originally been treated with a ready-made molecular chain or a first or second reagent which contained a ready-made group Q, the repairing reagent is suitably selected so as to resemble the "tail" which came off the molecular chain when the group Q was split.

The repair treatment can also be carried out in gaseous phase. A treatment in gaseous phase is not as easy as a liquid phase treatment, and since the quality of the repaired antisticking layer is often substantially the same, the liquid phase reaction is usually preferred. However, in case of very small nanostructures, that is structures of a size of less than about 100 nm, the reaction sometimes has to take place in gaseous phase in order to obtain a sufficiently even layer after the repair.

The repairing reagent should be added in large excess since this, for instance, makes the above-described internal sulfur bridges break, whereby the monomolecular layer on the surface of the stamp binds the repairing reagent instead. After the repair, the surface of the stamp will thus have, for instance, the following structure:

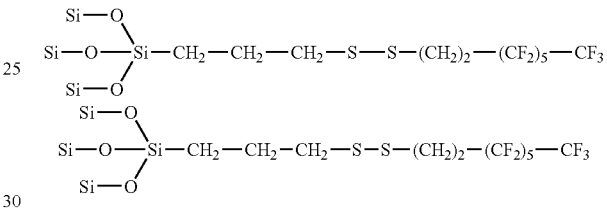

Therefore, one advantage of the present invention is that two relatively simple and cheap compounds, in the form of the first and the second reagent, can be used to form a stable antisticking layer with satisfactory chemical and mechanical properties. By using a group Q, the antisticking layer can be restored when damaged or worn. In a particularly preferred embodiment, in which the bond Q is weaker than the other bonds in the molecular chain, a well-defined fracture surface is obtained in case of damage, which surface does not have a detrimental effect on the ordered monomolecular structure. Then the antisticking layer can easily be repaired by the addition of a repairing reagent.

The expression "weaker" is used above for a bond, which unites a molecular chain and is included in the group Q, in the sense that said bond is weaker than the other bonds in the molecular chain as well as the bond that attaches the molecular chain to the surface of the stamp under the conditions (such as temperature, pressure, etc) prevailing in the nanoimprinting process. The expression "weaker" in connection with said bond is, however, to be interpreted in a wider sense. It is, for instance, possible to select a group Q which has a bond that is weaker under specific conditions. For instance, a stamp with a worn antisticking layer can, in connection with a repairing process, first be subject to conditions such that substantially all the groups Q are split, whereby a monomolecular layer is obtained in which each molecular chain has a group Q1 as end group. This layer can then be repaired by the addition of a repairing reagent according to that stated above. One advantage of exposing the stamp to conditions under which all the groups Q are split is that also molecular chains, which have been damaged in the embossing without the group Q being split, for instance molecular chains in which only the actual fluorine-containing group has been damaged, can be repaired. It will also be possible to repair damage which has occurred close to the surface of the stamp, since it will be easier for new molecules, which are intended to bind directly to the surface of the stamp, to reach the surface when the groups Q have been split and a "tail" has been removed from each molecular chain.

Examples of Q groups which are weaker under some conditions are esters and thioesters. In the former case, the surface of the stamp can first be provided with a first reagent in the form of an alcohol, for instance:

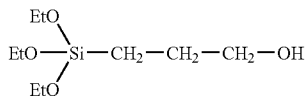

The first reagent is attached to the surface of the stamp, whereupon the stamp is treated with a second reagent in the form of a carboxylic acid, which for instance results in the following compound on the surface of the stamp by esterification:

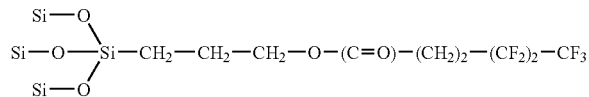

It is also possible to use a first reagent with an —SH group, in which case a thioester is formed, for instance:

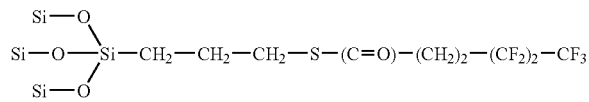

Naturally, it is also possible to first attach a first reagent with a carboxylic acid group to the surface of the stamp and then allow this carboxylic acid group to react with a second reagent in the form of a thiol or an alcohol. As the carboxyl acid group, under some conditions, can react with the surface of the stamp, this is less preferable.

The above ester bonds and thioester bonds are very strong bonds, which can be broken by dipping the stamp into a beaker which contains a liquid, such as a hydrochloric acid solution, with a low pH, for instance pH 0–2, which results in an acid ester hydrolysis, or a liquid, such as a sodium hydroxide solution, with a high pH, for instance pH 10–13, which results in an alkaline ester hydrolysis. In both cases, a group Q1 forms on the part of the respective molecular chains that is left on the surface of the stamp, which group Q1, after washing of the stamp, can react with a repairing reagent to restore the antisticking layer of the stamp.

Another example of the conditions under which a bond in the Q group is weaker is when affected by an enzyme. In this case, the stamp is dipped into a beaker which contains an aqueous solution with a suitable enzyme. The enzyme breaks bonds in Q groups and forms Q1 groups on the part of the respective molecular chains that is left on the surface of the stamp. After the enzyme treatment, the stamp is washed and can be repaired as described above. Examples of bonds that are weaker under the influence of a suitable enzyme are peptide bonds, which can be split by peptidases, for instance endopeptidases, such as pepsin, trypsin, papain, as well as ester bonds and thioester bonds, which can be split by peptidases, for instance carboxy peptidases, such as carboxy peptidase A.

It is also conceivable to etch away the entire molecule layer, for instance, by etching with hydrofluoric acid, HF, which attacks the surface layer of the stamp, such as silicon dioxide groups in case of a silicon surface, and subsequently attach a completely new molecule layer to the stamp according to one of the above-mentioned methods.

EXAMPLE 1

A stamp made of silicon was etched to form a nanostructured pattern. The stamp was washed with, in succession, trichloroethylene, ethanol and isopropanol. The stamp was subsequently dipped into a beaker with hexane at room temperature with 0.2% mercaptopropyltriethoxysilane, which corresponded to an excess amount of mercaptopropyltriethoxysilane, and was allowed to react for 4 h. The stamp was then removed from the beaker and cleaned with, in succession, trichloroethylene, ethanol and isopropanol. The stamp was dried and subsequently placed in a beaker, which contained hexane at room temperature with 2% 1H, 1H, 2H, 2H-perfluorooctanethiol. After 16 h, the stamp was removed from the vessel, washed with hexane in three successive baths and then dried. The stamp was tested in a nanoimprint lithography process and was found to resist 50 embossings without any particular signs of wear being detected.

EXAMPLE 2

A stamp made of silicon was patterned and washed in the manner described in Example 1. The stamp was subsequently placed in an oven, which had a temperature of 200° C. and was evacuated to a pressure of 1 kPa. Mercaptopropyltriethoxysilane was injected in large excess into the oven and vaporised. The stamp was allowed to react with the mercaptopropyltriethoxysilane for 3 h and was then removed from the oven and allowed to cool. The stamp was cleaned and treated with 1H, 1H, 2H. 2H-perfluorooctanethiol in liquid phase in the manner described in Example 1. The stamp was tested in a nanoimprint lithography process and was found to resist 50 embossings without any particular signs of wear being detected.

EXAMPLE 3

The experiment in Example 2 was repeated with materials and reagents according to Table 1:

TABLE 1

Combinations of materials and compounds used in Example 3.

| Surface of the stamp | First reagent | Second reagent |
| --- | --- | --- |
| Si | $(MeO)_3Si(CH_2)_3NH_2$ | $Cl(C=O)(CH_2)_2C(CF_3)_3$ |
| Si | $Cl_3Si(CH_2)_3SH$ | $SH(CH_2)_2(CF_2)_7CF_3$ |
| Si | $(EtO)_3Si(CH_2)_3OH$ | $HO(C=O)(CH_2)_2(CF_2)_2CF_3$ |
| Al | $(MeO)_3Si(CH_2)_3SH$ | $SH(CH_2)_2(CF_2)_5CF_3$ |
| Al | $Cl_3Si(CH_2)_3SH$ | $SH(CH_2)_2(CF_2)_2CF_3$ |
| Ni* | $(EtO)_3Si(CH_2)_3SH$ | $SH(CH_2)_2(CF_2)_5CF_3$ |
| Ti | $(EtO)_3Si(CH_2)_3SH$ | $SH(CH_2)_2(CF_2)_5CF_3$ |

*The surface of Ni was first treated with an oxygen plasma to oxidize the surface.

The finished stamps were tested in a nanoimprint lithography process and all of them were found to resist 50 embossings without any particular signs of wear being detected.

EXAMPLE 4

A stamp manufactured according to Example 2, after several hundred embossings, started to show signs of sticking to the polymer layer when the stamp was to be removed after embossing. The sticking was detected by examining the surface of the stamp in an optical microscope, which showed that residues of the polymer layer were stuck to the surface of the stamp. The stamp was cleaned by being dipped into three successive baths with hexane. The stamp was then placed in a beaker which contained hexane at room temperature with 2% of 1H, 1H, 2H, 2H-perfluorooctanethiol, which was present in large excess. After 16 h, the stamp was removed from the vessel, cleaned with hexane in three successive baths and then dried. The repaired stamp was tested in a nanoimprint lithography process and was found to resist 50 embossings without any particular signs of wear being detected. The antisticking functionality of the repaired stamp was, as far as could be judged, equal to that of a new stamp.

The invention claimed is:

1. A stamp for use in transferring a pattern in nanoscale comprising a stamp having a monomolecular antisticking layer, said antisticking layer having molecular chains, which are covalently bound to a surface of the stamp and which each contains at least one fluorine-containing group and at least one silane group, each molecular chain containing a group Q present between the at least one fluorine-containing group and the at least one silane group, which Q group has a bond which is weaker than the other bonds in the molecular chain as well as the covalent bond that binds the molecular chain to the surface of the stamp, said bond in the group Q being capable of being split to create a group Q1 that is attached to a part of the molecular chain including the at least one silane group that is bound to the surface of the stamp when the bond in the group Q is split and which group Q1 is capable of reacting with a fluorine-containing compound to restore the antisticking layer.

2. The stamp as claimed in claim 1, in which the surface of the stamp is made of a material M, which is selected from silicon, aluminum, nickel, chromium and titanium or oxides thereof, the silane group of the antisticking layer being bound to the surface by means of at least one group B1, which group B1 is selected from M- or M-O-.

3. The stamp as claimed in claim 2, in which the antisticking layer has a first part, which has the general formula $(B1)_{3-n}R'_{n}SiR1X1$, where n is 0, 1 or 2, R' is an aliphatic, saturated carbon compound, Si is the silane group, R1 is a carbon chain and where X1 is a first coupling group, and a second part, which has the general formula X2R2, where X2 is a second coupling group which is bound to X1 and which together with X1 forms the group Q and where R2 is a fluorine-containing hydrocarbon compound.

4. stamp as claimed in claim 3, in which R1 is a carbon chain which has a length from the silane group to X1 of 2–10 carbon atoms.

5. The stamp as claimed in claim 4, in which said carbon chain of R1 is saturated and unsubstituted.

6. The stamp as claimed in claim 3, in which R2 is a carbon chain which has a length from the end group to X2 of 2–10 carbon atoms.

7. The stamp as claimed in claim 6, in which R2 is branched at the free end, each branch comprising at least one perfluorinated carbon atom.

8. The stamp as claimed in claim 6, in which said carbon chain of R2 is saturated and includes at least one perfluorinated carbon atom.

9. The stamp as claimed in claim 3, in which n is 0.

10. The stamp as claimed in any one of claims 1 and 2-9, in which the group Q is a sulfur bridge.

11. A method of providing a monomolecular antisticking layer including molecular chains on a stamp for use in transferring a pattern in nanoscale, comprising the steps of:
reacting the surface of the stamp with a first reagent, which has a hydrolizable first functional group, and a second functional group, to covalently bind the first functional group of the first reagent to the surface of the stamp,
treating the surface of the stamp with a second reagent, which has a first end capable of reacting with the second functional group of the first reagent, and a second end having at least one fluorine-containing group, and
binding the first end of the second reagent to the second functional group of the first reagent, thereby forming a group Q which group Q has a bond which is weaker than the other bonds in the molecular chain as well as the covalent bond that binds the molecular chain to the surface of the stamp, wherein splitting of said bond in the group Q creates a group Q1, which is attached to a part of the molecular chain that is bound to the surface of the stamp when the bond in the group Q is split and which group Q1 is capable of reacting with a fluorine-containing compound to restore the antisticking layer.

12. The method as claimed in claim 11, in which the first reagent is converted into gaseous phase before it is reacted with the surface of the stamp.

13. The method as claimed in claim 11, in which the treatment with the second reagent is carried out in liquid phase.

14. A method of repairing a damaged monomolecular antisticking layer on a stamp having a monomolecular antisticking layer having molecular chains which are covalently bound to the surface of the stamp and which each contains at least one fluorine-containing group and at least one silane group, each molecular chain containing a group Q present between the at least one silane group and the at least one fluorine-containing group, which group Q has a bond which is weaker than the other bonds in the molecular chain as well as the covalent bond that binds the molecular chain to the surface of the stamp, said bond in the group Q creating a group Q1 which is attached to a part of the molecular chain including the at least one silane group that is bound to the surface of the stamp when the bound in the group Q is split and which group Q1 is capable of reacting with a fluorine-containing compound to restore the antisticking layer, comprising treating the stamp with a repairing reagent, which has a coupling end, which is capable of reacting with the group Q1, and a fluorine-containing group located at the other end of the repairing reagent, and binding the coupling end of the repairing reagent to the group Q1 which is attached to the surface of the stamp, the group Q being formed anew.

15. The method as claimed in claim 14, in which the stamp is first treated for splitting substantially all groups Q.

* * * * *

UNITED STATES PATENT AND TRADEMARK OFFICE
CERTIFICATE OF CORRECTION

PATENT NO. : 7,137,336 B2  
APPLICATION NO. : 10/482710  
DATED : November 21, 2006  
INVENTOR(S) : Babak Heidari et al.

Page 1 of 1

It is certified that error appears in the above-identified patent and that said Letters Patent is hereby corrected as shown below:

\*   In claim 4, column 13, line 59, before "stamp", insert --The--.

In claim 14, column 14, line 53, "the bound in" should read --the bond in--.

Signed and Sealed this

Twenty-ninth Day of April, 2008

JON W. DUDAS  
*Director of the United States Patent and Trademark Office*